United States Patent [19]

Chang et al.

[11] 4,135,954

[45] Jan. 23, 1979

[54] METHOD FOR FABRICATING SELF-ALIGNED SEMICONDUCTOR DEVICES UTILIZING SELECTIVELY ETCHABLE MASKING LAYERS

[75] Inventors: Augustine W. Chang, Wappingers Falls; Arun K. Gaind, Fishkill, both of N.Y.

[73] Assignee: International Business Machines Corporation, Armonk, N.Y.

[21] Appl. No.: 814,801

[22] Filed: Jul. 12, 1977

[51] Int. Cl.² .................... H01L 21/22; H01L 21/316
[52] U.S. Cl. ...................................... 148/187; 29/571; 29/576 W; 29/578; 148/1.5; 148/175; 156/643; 156/652; 156/653; 156/657; 156/662; 357/23; 357/40; 357/42; 357/50; 357/54
[58] Field of Search ......................... 148/1.5, 187, 175; 29/571, 576 W, 578; 156/650, 652, 653, 657, 661, 662, 643; 357/48, 49, 50, 54

[56] References Cited

U.S. PATENT DOCUMENTS

| | | | |
|---|---|---|---|
| 3,479,237 | 11/1969 | Bergh et al. | 148/187 X |
| 3,560,278 | 2/1971 | Sanera | 148/187 |
| 3,771,218 | 11/1973 | Langdon | 156/661 X |
| 3,783,047 | 1/1974 | Paffen et al. | 148/187 |
| 3,833,429 | 9/1974 | Monma et al. | 357/54 X |
| 3,860,466 | 1/1975 | Workman et al. | 148/187 X |
| 3,883,372 | 5/1975 | Lin | 357/54 X |
| 3,900,352 | 8/1975 | Potter | 148/187 |
| 3,948,694 | 4/1976 | Mills | 148/187 |
| 4,021,270 | 5/1977 | Hunt et al. | 148/187 X |
| 4,044,452 | 8/1977 | Abbas et al. | 29/571 |

OTHER PUBLICATIONS

Dhaka et al., "Masking Technique" I.B.M. Tech. Discl. Bull., vol. 11, No. 7, Dec. 1968, p. 864–865.

*Primary Examiner*—L. Dewayne Rutledge
*Assistant Examiner*—W. G. Saba
*Attorney, Agent, or Firm*—Thomas F. Galvin

[57] ABSTRACT

A method for fabricating self-aligned regions of semiconductor devices such as bipolar or field effect transistors using three masking layers which are selectively etchable with respect to each other on the surface of the semiconductor body. A dimensional mask is deposited over the three layers so that the set of all of the self-aligned impurity regions to be formed through the surface of the body are defined by etching the upper masking layer, with the intermediate layer acting as an etch-stop. Using conventional wet or dry resist processes, each subset of similar impurity regions may then be formed selectively through the intermediate and lower layers without the need for precisely aligning any subsequent mask.

16 Claims, 15 Drawing Figures

METHOD FOR FABRICATING SELF-ALIGNED SEMICONDUCTOR DEVICES UTILIZING SELECTIVELY ETCHABLE MASKING LAYERS

CROSS REFERENCE TO RELATED APPLICATIONS

This application is related to a copending application in the names of B. C. Feng et al, filed, July 12, 1977, Ser. No. 814,829 and assigned to the present assignee.

This application is also related to a copending application in the name of Klaus D. Beyer, filed Mar. 3, 1977, Ser. No. 773,885, now U.S. Pat. No. 4,110,125 and assigned to the present assignee.

BACKGROUND OF THE INVENTION

1. Field of the Invention

This invention relates to the fabrication of large scale integrated circuits within a single semiconductor substrate. In particular, it relates to fabricating such devices having greatly reduced size.

2. Description of the Prior Art

A principal critical factor in designing the layouts of semiconductor chips is the power dissipation, which is the limiting factor both in the number of devices or circuits which may be contained within a chip of given size as well as the speed of operation of a given circuit. Generally speaking, the faster the circuit, the more power which is dissipated thereby. Additionally, the power dissipation is a direct function of the number of devices on a given chip.

One solution to this problem has long been recognized: reduce the size of the individual devices. Not only does this solution allow more transistors to be fabricated within a chip of a given size but it also lowers the parasitic capacitances of each device. This permits operation at a higher impedance level for a given operating speed, thereby resulting in lower power dissipation.

The problem of power dissipation is particularly severe in the design of vertical bipolar transistors of the planar type. However, it is also a factor to be considered in the design of both lateral bipolar transistors as well as field effect transistors.

With respect to vertical bipolar transistors it is critical that the base, collector reach-through and isolation regions be aligned properly; each of these regions is fabricated separately.

The definition of each of these impurity regions requires a separate masking operation. The formation of each region may include diffusion, ion implantation, dielectric isolation or combinations of these. Conventionally, the masking operations involve coating a suitable dielectric layer disposed on the substrate with a photoresist, exposing the photoresist actinically through a mask, developing the photoresist pattern defined by the mask, and etching the dielectric layer through the photoresist down to the semiconductor surface. Other techniques such as the use of E-beam resists and plasma etching are also becoming commonplace.

As previously mentioned, the limiting factor in reducing the size of the regions and the distances between regions is the registration tolerance of the masks. Conventionally, each mask must be aligned perfectly with respect to the patterns formed by previous masks. Perfect alignment can never be assured; and tolerances, commonly termed design ground rules, must take this into account. This results in devices which have larger distances between adjacent regions than is necessary to satisfy circuit parameters.

Similar reasoning applies to any complex circuits using such devices as lateral bipolar transistors, complementary field effect transistors or other types of advanced devices.

Relatively recently, semiconductor designers have turned to the use of self-alignment masking techniques as a way of avoiding the need for perfect mask alignments at each step. U.S. Pat. Nos. 3,928,082, 3,948,694, 3,967,981 and 3,900,352, the last-mentioned being assigned to the same assignee as the present application, are examples of such self-aligned techniques. However, the manufacturing application of these processes is somewhat limited, either by the necessity for the ion implantation of one or more impurity regions through a mask or with respect to the number of impurity regions which may be self-aligned. For example, to our knowledge it has not been possible to "self-align" a dielectric isolation region either with respect to the base and collector contact regions of a bipolar transistor or with respect to the source, drain and substrate contacts of a field effect transistor.

Another problem apparently not fully appreciated by designers using prior art self-alignment techniques is the well known lateral undercutting of one masking layer which is disposed beneath another during an etching process. The undercut portion increases the effective masking window for impurities and could result in the overlapping of regions which should be spaced apart.

SUMMARY OF THE INVENTION

It is, therefore, the primary object of our invention to provide an improved method for reducing the size of semiconductor devices fabricated within a single substrate.

It is another object of our invention to provide an improved method for reducing the distance between such devices.

It is yet another object of our invention to fabricate self-aligned regions in a semiconductor without being affected by substantial undercutting.

These and other objects of our invention are achieved by placing a dimensional mask, which defines the set of all of the self-aligned regions to be formed through a major surface of the substrate, atop three separate, selectively etchable masking layers on the surface of the semiconductor body. Preferably, these layers comprise: (1) a silicon dioxide/silicon oxynitride composite, (2) silicon dioxide, and (3) silicon nitride.

The upper layer, which is advantageously the silicon nitride layer, is patterned using the dimensional resist mask so that the set of impurity regions ultimately to be formed are defined by etching the nitride layer. The intermediate silicon dioxide layer acts as an etch-stop.

Then, using "block-out" masks and conventional lithographic processing, windows are formed in separate steps to the silicon substrate where each subset of regions are separately formed. In some processes, the windows may be etched only down to the lower layer, and the impurity regions may be formed therethrough. The block-out masks require no critical alignment techniques either with respect to each other or to the dimensional mask. Depending on the type of device fabricated, the dimensional mask itself may not require critical alignment.

DESCRIPTION OF THE PREFERRED EMBODIMENTS

Figure 1A:
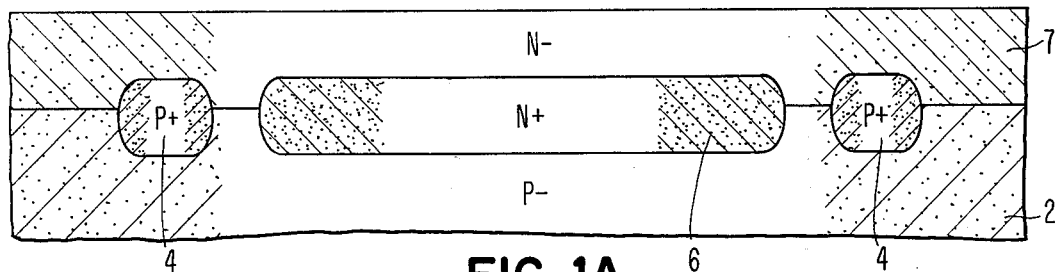
FIGS. 1A–1I are sectional views showing the steps of our novel method used to produce a bipolar transistor.

Turning now to the drawings, in FIG. 1A a P type silicon substrate is utilized to form an NPN semiconductor device which is isolated from other devices (not shown) on the same chip by means of dielectric isolation. It will be understood, of course, that our invention is also applicable to opposite-conductivity-type bipolar transistors. As will be discussed with respect to the other drawings, our invention is also applicable to other semiconductor devices such as field effect transistors.

P− substrate 2 has disposed thereon an N− epitaxial layer 7, A N+ subcollector region 6 and a P+ junction isolation region 4 are formed in accordance with standard techniques which are well known to those of skill in the art. Although our invention is suited to the use of these buried regions, which are quite common at the present state of the art, they are not necessary for practice of the invention.

Figure 1B:
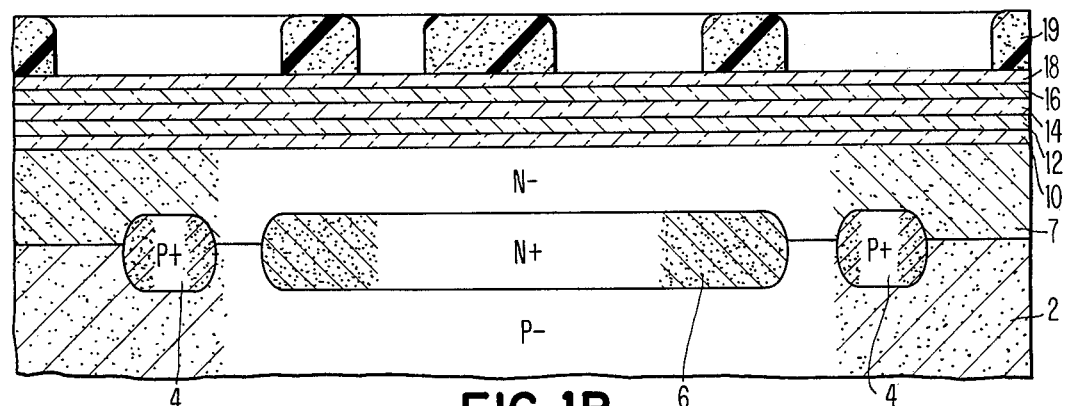

In FIG. 1B three distinct masking layers are formed atop epitaxial layer 7 in preparation for the formation of impurity regions within layer 7. There are, in fact, five separate layers enumerated 10, 12, 14, 16 and 18 atop the substrate; however, as will be described, layers 10 and 12 comprise a composite masking layer and layer 18, although preferred, is not required to practice our invention.

Disposed atop the upper surface of layer 18 is a dimensional mask 19 which defines the set of the self-aligned impurity regions wich are to be formed in epitaxial layer 7. Mask 19 is advantageously a standard photo or E-beam resist material such as AZ111 or AZ1350J which is exposed and developed conventionally. For our purposes, the term impurity region includes dielectric isolation.

In our preferred embodiment the masking layers are comprised as follows: layer 10 is silicon dioxide; layer 12 is silicon oxynitride; layer 14 is silicon dioxide; layer 16 is silicon nitride; and layer 18 is silicon dioxide. Each of the layers is deposited using techniques which are known in the art and in themselves form no part of our invention.

Silicon dioxide layer 10 is advantageously thermally grown from the silicon layer 7 to a thickness of between 250Å to 1000Å. Silicon oxynitride layer 12 is preferably deposited by a silane-carbon dioxide-ammonia-hydrogen chemical vapor deposition technique with a refractive index of around 1.8 and to a thickness of around 500 to 1000Å. This process is described in the publication by Gaind et al entitled "Oxynitride Deposition Kinetics in a $SiH_4$-$CO_2$-$NH_3$-$H_2$ System", J. Electrochem Soc., Volume 124, No. 4, April 1977, pages 599–606.

Silicon dioxide layers 14 and 18 are also preferably chemically vapor deposited to a thickness of around 500Å and 1000 to 2000Å, respectively, in a silane-carbon dioxide hydrogen system. Silicon nitride layer 16 is advantageously deposited in a silane-ammonia-hydrogen chemical vapor deposition system to a thickness of between 500 to 1000Å.

Most advantageously, layers 10, 14 and 18 have thicknesses of 250Å, 500Å, 1000Å, respectively, for bipolar transistors. Generally, the ratio of thickness of these layers is 1:2:4 so as to prevent the undercutting of an upper layer in one region when the lower layer in another region is being etched.

Our invention is not limited to these deposition techniques or to these particular materials. The broadest aspect contemplates the use of but three masking layers which are selectively etchable with respect to each other. By this we mean that a particular etchant which attacks one of the materials will not attack the other two materials as quickly.

In the present embodiment the three materials which are selectively etchable with respect to each other are silicon oxynitride layer 12, silicon dioxide layer 14 and silicon nitride layer 16. For example, hot phosphoric acid attacks silicon nitride but does not substantially attack silicon dioxide. It also attacks silicon oxynitride roughly 2½ times faster than silicon nitride. Buffered hydrofluoric acid attacks silicon dioxide but does not substantially attack either silicon nitride or silicon oxynitride.

The etching steps could also be accomplished by plasma (reactive ion) etching. With plasma etching silicon oxynitride etches two to three times faster than silicon nitride; and chemically-vapor-deposited silicon dioxide etches six to ten times slower than silicon nitride. In addition, with plasma etching in Diode System where etching is anisotropic the silicon oxynitride layer could be replaced by silicon nitride. In this case, silicon nitride layer 16 should be at least twice as thick as layer 12.

Moreover, other masking materials could be used. For example, chrome or alumina could be utilized in place of silicon nitride, and molybdenum could replace silicon oxynitride. Where recessed oxidation is not used, nitride or oxynitride could be replaced by polycrystalline silicon, which is selectively etchable using pyrocatechol.

Figure 1C:
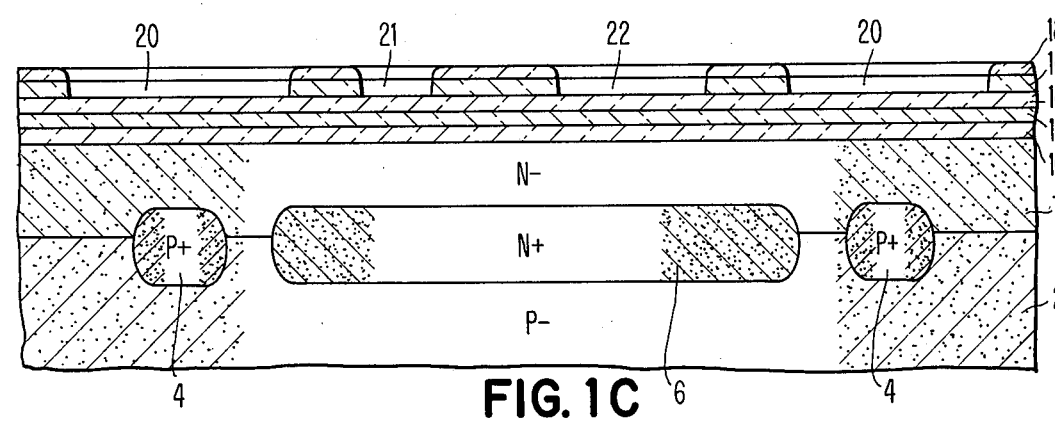

Returning to the figures, in FIG. 1C openings 20, 21 and 22 are etched in the exposed regions of layers 18 and 16 using the dimensional mask 19. Silicon dioxide layer 18 is first etched using buffered hydrofluoric acid, which will attack silicon dioxide but not silicon nitride or the photoresist. After openings are made in layer 18, it is used as a mask when etching conformal openings 20, 21 and 22 in silicon nitride layer 16.

The sole purpose of oxide layer 18 is to mask the nitride layer 16, because etchants such as hot phosphoric acid which attack silicon nitride also attack conventional resists. Sputtered $SiO_2$ or other well-known masks could be substituted for the chemically vapor deposited layer 18. Moreover, layer 18 could be omitted entirely if the etching were accomplished in a plasma system. This type of etching is commonly termed reactive ion or plasma etching. For example, nitride layer 16 may be etched using a combination of $CF_4$ and $O_2$ gas in a plasma system and using AZ135OH resist as a mask. A suitable plasma system is marketed by the LFE Corporation; and a suitable gas is marketed as DE100, also by the LFE Corporation. AZ1350J and H are products of the Shipley Company.

In our preferred embodiment, the area in substrate 7 under region 20 will be converted to a dielectric isolation region; the area under region 21 will comprise a contact region to the subcollector 6; and the area under region 22 will comprise the base of the bipolar transistor. These three regions will be "self-aligned" with respect to each other because of our novel process.

Figure 1D:
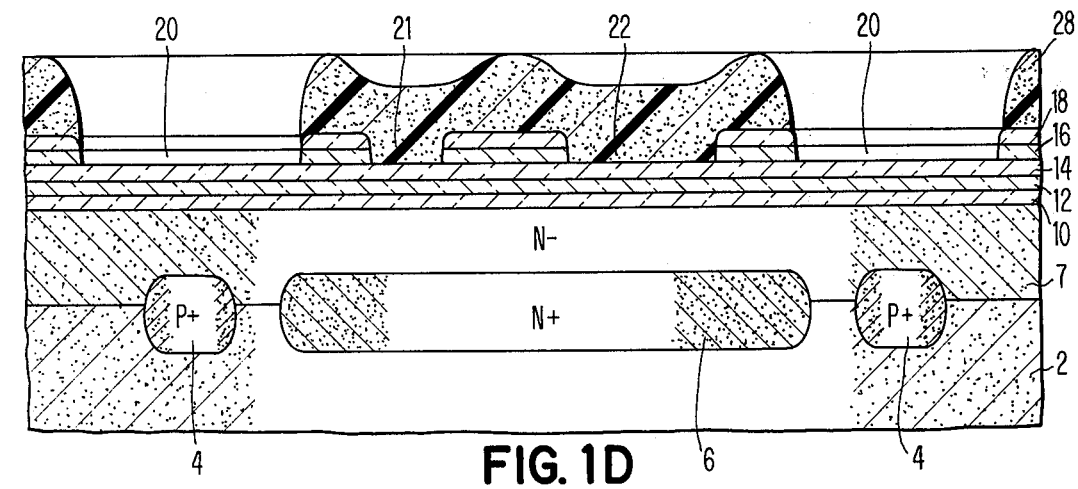

A "block-out" resist mask 28 is shown in FIG. 1D as covering regions 21 and 22 but not region 20. The openings for window 20 in mask 28 does not constitute a critical alignment step because silicon nitride layer 16 acts as an effective block to any significant enlargement of window 20 in the lateral (horizontal) direction. Thus, the edges of resist 28 need not be perfectly aligned with the edges of layers 18 and 16.

Figure 1E:
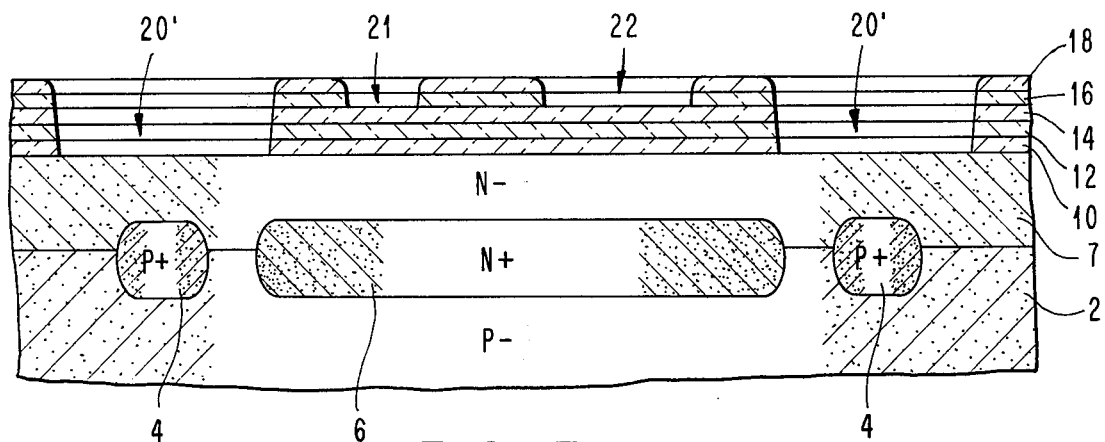

As illustrated in FIG. 1E, a window 20' is now opened down to epitaxial layer 7 by etching silicon dioxide layer 14 in a buffered HF solution, (thereby also removing resist 28) etching silicon oxynitride layer 12 with hot phosphoric acid and then etching silicon dioxide layer 10 in buffered HF.

During the etching of silicon oxynitride layer 12, silicon dioxide layer 14 acts as a mask; and during the etching of silicon dioxide layer 10, silicon oxynitride layer 12 acts as a mask. Silicon dioxide layer 10 functions as an interface between silicon oxynitride layer 12 and the bare silicon substrate. Silicon oxynitride tends to cause higher defect densities than silicon dioxide. However, the latter is not critical to the utility of our process. During formation of oxide isolation, silicon in the neighborhood of oxynitride shows dislocations which may reduce yield. To avoid this, we place a minimum of 250Å of $SiO_2$ or any other dielectric which puts the silicon under tensile stress beneath the oxynitride.

Figure 1F:
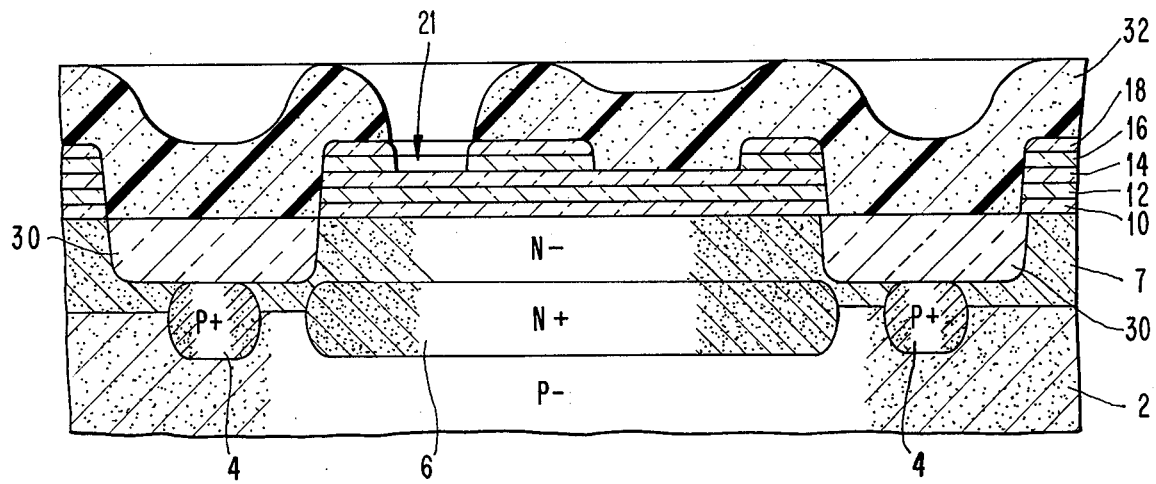

With window 20' now formed to the surface of epitaxial layer 7, dielectric isolation region 30 can be formed as illustrated in FIG. 1F. Region 30 is preferably silicon dioxide which may be thermally grown from silicon layer 7, which is a common technique. Preferably, however, dielectric isolation 30 is formed by first etching away a desired amount of silicon using a plasma etching system with argon and chlorine gas as the active material; or a wet etchant such as sodium hydroxide may be used. The silicon is etched down to around 0.4 microns in a 2 micron epitaxial layer and then oxidized to around 1 micron of silicon dioxide.

It should be noted at this point that region 30 may also comprise material other than a dielectric. For example, the region may comprise a P+ isolation, as is known in the prior art. It may be formed either by ion implantation or diffusion techniques.

Broadly speaking, the region formed at this point may perform a function other than isolation. For example, a region which contains a resistor, Schottky barrier diode or other type of semiconductor region could be fabricated instead.

Moreover, it is not necessary in all cases to open the windows down to the bare silicon substrate. For example, some ion implantation procedures are best accomplished through a thin insulation layer. Therefore, either layers 10 or 12, or both, might be left intact and an ion implantation performed through them into layer 7. The important feature from the standpoint of our invention is that the region is formed in self-alignment with the other regions to be formed in subsequent steps.

After the formation of region 30, a second block-out mask 32 is deposited, exposed and developed to expose window 21 as shown in FIG. 1F. As with mask 28, mask 32 is a conventional resist material which is capable of protecting all areas except those which are to be opened to epitaxial layer 7.

Figure 1G:
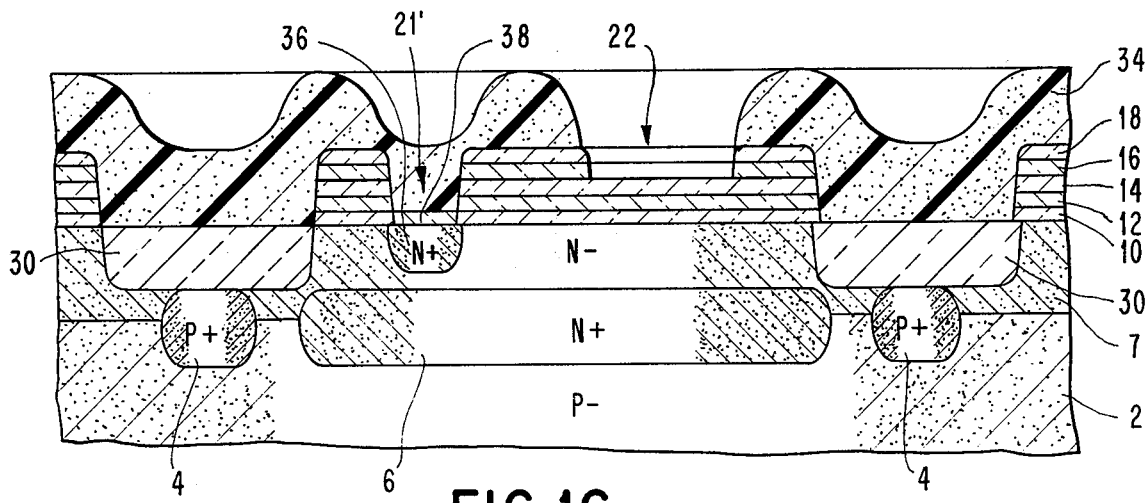

An opening, denoted as 21' in FIG. 1G, is then etched in window 21 down to layer 7 using the same technique as previously described for window 20'. During the etching of the exposed portion of silicon dioxide layer 14, or after the step is completed, layer 32 is completely removed from the substrate. After window 21 is completed to the layer 7 N+ region 36, which functions either as a reach-through to subcollector 6, or as a contact to layer 7, is formed by diffusion or ion implantation. After the formation of region 36, a thin oxide layer 38 is formed to protect region 36 against contamination by the next block-out mask 34 to be formed. Depending on the process parameters, layer 38 may not be necessary. The third block-out mask is identified by the numeral 34 in FIG. 1G. As with the other block-out masks, mask 34 serves to protect those regions of the masking layers which are not to be etched down to epitaxial layer 7. In the present embodiment, layer 34 serves to expose only window 22 under which the base and emitter of the bipolar transistor are to be formed. Window 22 is then etched down to the surface of epitaxial layer 7 using the same etching techniques as previously described to form window 22'. A P+ region 40 is then formed in the epitaxial layer 7 to serve as the base region.

Figure 1H:
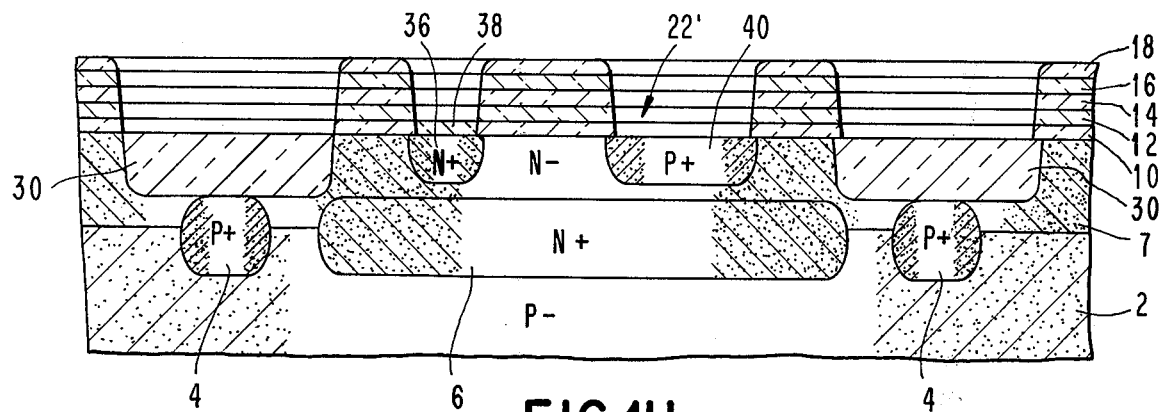
Figure 1I:
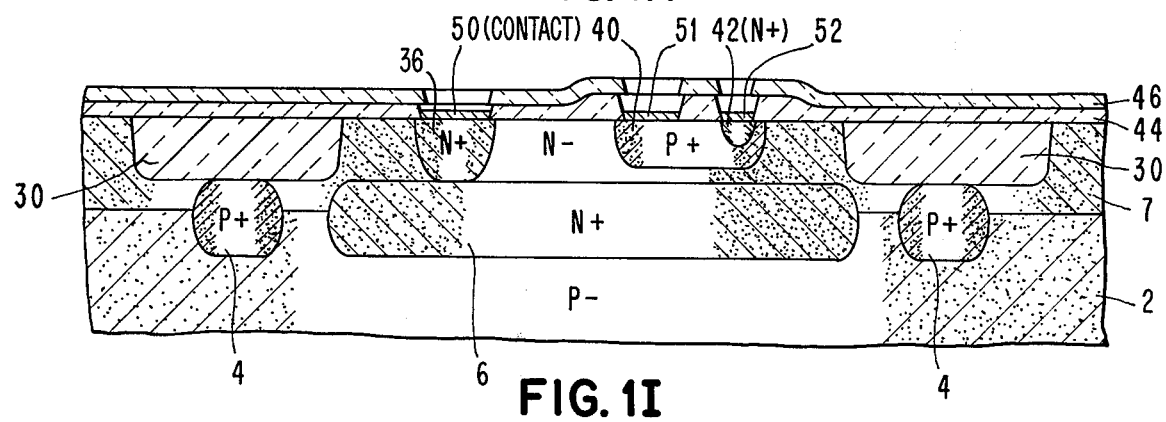

The structure shown in FIG. 1H represents the completion of the inventive steps in our novel process. In FIG. 1I an emitter region 42 is formed in base region 40, by conventional methods or using the techniques described in the cross-referenced copending applications of Klaus D. Beyer or B. C. Feng et al. These applications are incorporated by reference in this application.

While our invention has shown and described the fabrication of an NPN transistor, it should be understood that a PNP transistor could be formed in substantially the same way. Clearly, this would necessitate that substrate 2 and epitaxial layer 7 be of opposite conductivity types to their present conductivity types. It also should be understood that there are a plurality of various integrated components which may be formed within substrate 2 using the techniques described. Moreover, the particular series of steps described in FIGS. 1A-1I need not be followed. The order may be permuted; e.g., region 36 might be formed after region 40 instead of before.

Figure 2:
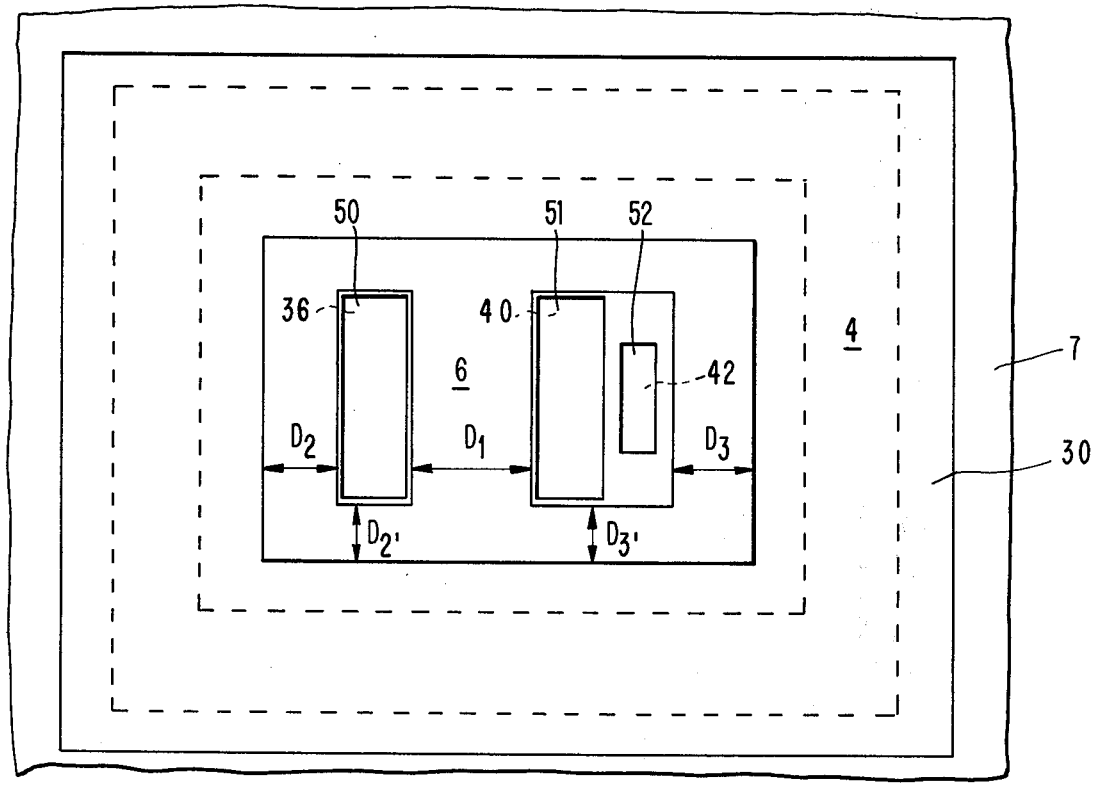
FIG. 2 illustrates the top view of the transistor region at the stage of fabrication of FIG. 1I.

FIG. 2 is a plan view of the device which is shown in cross-section in FIG. 1I. The critical dimensions of the fabrication process which are now carefully controlled by our self-alignment technique are denoted as D1, D2 and D2' and D3 and D3'. Dimensions D2-D2' and D3-D3' may have the same or different values depending on the design parameters. By the use of our self-aligned technique, distance D1 between collector contact 36 and base region 40 may typically be designed to between one micron to four microns; distance D2 (or D2') between contact 36 and isolation region 30 may be typically 1-2.5 microns; and distance D3 (or D3') between base region 40 and isolation region 30 may be 1-2.5 microns. This will be recognized by those of skill in the semiconductor design art as being substantially better than what is presently achievable using standard techniques. In fact, the spacings may even be smaller, depending on factors which are not due to any limitations in our self-aligning process. The values for D3/D3' assume that it is desired to maintain a spaced relationship between base 40 and isolation 30. Some designs, however, permit the base to abut the dielectric isolation region. Our process could still be used in this instance, but the alignment of base 40 with respect to region 30 would not be critical.

Our process is especially suited for E-beam lithography or projection printing where the above-described dimensions may be as low as 0.6 microns. The ultimate thrust of this process to allow an increase in L.S.I. density, because now smaller devices can be fabricated with high yield.

FIGS. 3A–3E illustrate another embodiment of our invention in which complementary metal-oxide-semiconductor field effect transistors (CMOSFET's) are fabricated.

Figure 3A:
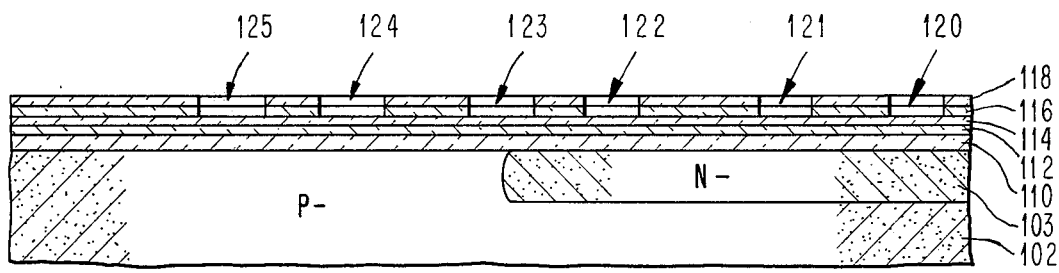
FIGS. 3A–3E are sectional views of a CMOSFET as it is fabricated using our novel method.

In FIG. 3A a P− substrate 102 contains an N− well or pocket 103. Disposed atop the entire substrate are five separate layers enumerated 110, 112, 114, 116 and 118. These regions correspond in our preferred embodiment exactly with regions 10, 12, 14, 16, and 18 in the description with regard to FIGS. 1A–1H. Thus, layer 110 is silicon dioxide; layer 112 is silicon oxynitride; layer 114 is silicon dioxide; layer 116 is silicon nitride; and layer 118 is silicon dioxide. The layers are advantageously deposited using the same techniques as previously described. As is well known in the art regarding CMOSFET's, N− region 103 is used to form the P channel FET and the adjacent portion of P- substrate 102 is used to form an N channel FET. Thousands of such devices may be formed on a single semiconductor chip. Isolation regions, typically in the form of diffused or dielectric isolation guard rings are used to isolate the field effect transistors from one another.

Openings in layers 118 and 116 are etched using a dimensional mask, as in the previous embodiment. The openings are identified by the numerals 120 through 125. The areas in well 103 under windows 120 and 121 will comprise, respectively, the source and drain regions of a P channel field effect transistor. The area under opening 122 will comprise a N+ contact region to well 103. The area under opening 123 will comprise an isolation region. The areas under openings 124 and 125 will comprise, respectively, the source and drain regions of an N channel field effect transistor. These are typical but by no means exclusive regions which are formed within a semiconductor substrate for CMOSFET's. See, for example, U.S. Pat. No. 3,955,210, issued to Bhatia et al for a different design which could be made with our process.

The mask used to form said openings 120-125 corresponds to mask 19 in FIG. 1B. This, its illustration has been omitted as superfluous.

Figure 3B:
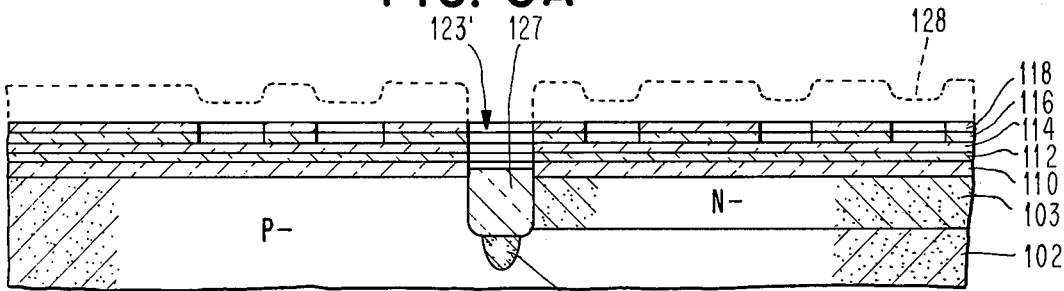

Turning to FIG. 3B, window 123' is now opened down to the area in substrate 102 which intersects well 103. This is done by the use of a block-out mask 128 which is shown in phantom lines because, by the time opening 123' is formed down to substrate 102, the mask has been removed. Window 123' is formed in the same way as previously described with respect to the bipolar transistor embodiment. Silicon dioxide layer 114 is etched in a buffered HF solution, silicon oxynitride layer 112 is etched with hot phosphoric acid and silicon dioxide layer 110 is etched in buffered HF. During the etching of layer 112, silicon dioxide layer 114 acts as a mask; and during the etching of silicon dioxide layer 110, silicon oxynitride layer 112 acts as a mask.

With window 123' now formed to the surface of substrate 102, isolation regions 126 and 127 are formed as illustrated in FIG. 3B. Region 126 is a P+ region which functions as a channel stop under dielectric isolation region 127. Region 127 is preferably formed in the same way as dielectric isolation region 30 with regard to the previously-described bipolar transistor embodiment. P+ region 126 may be formed either by ion implantation or diffusion prior to the formation of region 127 and through the same window. These techniques and the regions for them are well known to those of skill in the art. Those of skill in the art will also be aware that other types of isolation regions such as N+ or P+ guard rings or both may be formed instead of region 127. These types of structures are also within the purview of our invention.

Figure 3C:
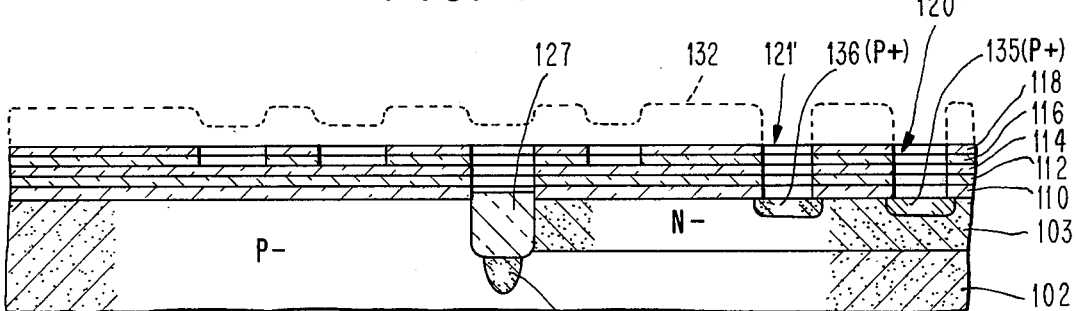

After the formation of isolation region 27, a second block mask 132 is deposited, exposed and developed to expose windows 120' and 121'. These openings are formed using the same techniques as previously described for opening 123'. P+ regions 135 and 136 are then formed, by diffusion or ion implantation or a combination of either, to function as the source and drain regions of a P channel field effect transistor as shown in FIG. 3C.

Figure 3D:
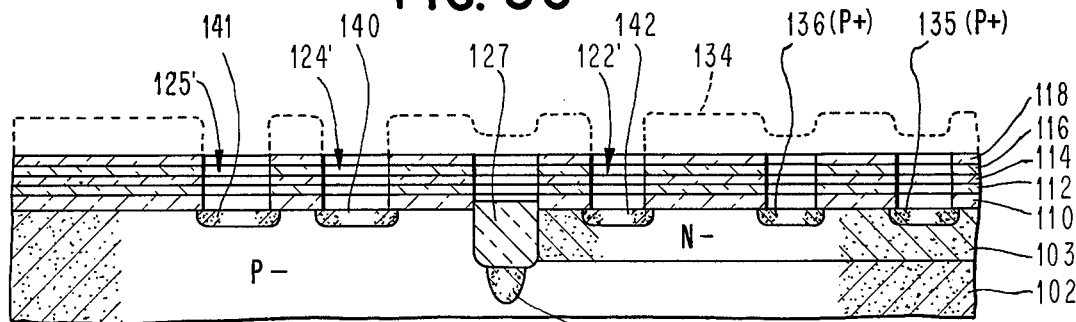

The formation of regions 140, 141 and 142 shown in FIG. 3D completes the novel portion of our process. These regions are formed by means of a third block mask 134 which is used to protect all of the semiconductor substrate with the exception of windows 122, 124 and 125. Windows 122', 124' and 125' are then formed, after which N+ regions 142, 140 and 141 are diffused in the respective openings. Regions 140 and 141 comprise the source and drain of an N channel field effect transistor and region 142 is a contact to well 103, which is conventionally used to bias the well.

Figure 3E:
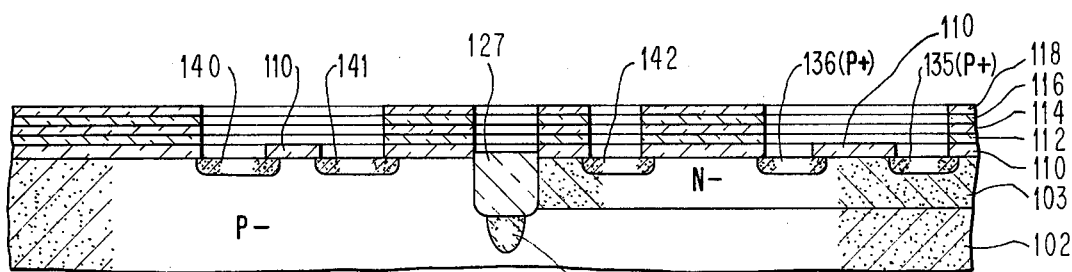

A completed CMOSFET may be formed by removing those portions of the masking layers from the surface of the channel regions 109 of the FET's and applying thin insulating layers as the gate insulation. Contacts and gate electrodes (not shown) are then deposited to form an operative CMOSFET. Alternatively, masking layer 110 may remain as the gate insulator, as shown in FIG. 3E. In such a case, the thicknesses of oxide layers 110, 114 and 118 are preferably 500Å, 1000Å and 2000Å, respectively.

While our invention has been particularly shown and described with respect to preferred embodiments thereof, it will be understood by those skilled in the art that the foregoing and other changes in form and details may be made without departing from the spirit and scope of our invention.

For example, the particular arrangement of masking layers described may be varied, as may the order of forming the various impurity regions.

We claim:
1. A method of manufacturing integrated circuits comprising the steps of:
   forming, atop a semiconductor substrate, superimposed first, second and third layers of masking material which are selectively etchable with respect to each other;
   etching a predetermined set of openings in said first layer while not affecting said second layer;
   etching a first sub-set of openings within said predetermined set of openings through at least said second masking layer while protecting the other openings in said set, said first masking layer functioning as a mask for said second masking layer;
   forming first regions in said substrate through said first sub-set of openings;
   etching a second sub-set of openings within said predetermined set of openings through at least said second layer while protecting the other openings in said set;

forming second regions in said substrate through said second sub-set of openings;

etching a third sub-set of openings within said predetermined set of openings through at least said second layer while protecting the other openings in said set; and forming third regions in said substrate through said third sub-set of openings.

2. A method as in claim 1 wherein said first, second and third layers comprise silicon nitride, silicon dioxide and silicon oxynitride, respectively.

3. A method as in claim 2 wherein:
said etching of said silicon nitride and said silicon oxynitride layer is accomplished in hot phosphoric acid; and
said etching of said silicon dioxide layer is accomplished in buffered hydrofluoric acid.

4. A method as in claim 2 wherein said etching steps are accomplished by reactive ion etching.

5. A method as in claim 2 further comprising the step of forming another layer of silicon dioxide between said substrate and said silicon oxynitride layer.

6. A method as in claim 2 further comprising the step of forming another layer of silicon dioxide atop said silicon nitride layer.

7. A method as in claim 6 further comprising the step of forming another layer of silicon dioxide between said substrate and said silicon oxynitride layer.

8. A method as in claim 7 wherein the thicknesses of said silicon dioxide layer disposed above said silicon nitride layer, said silicon dioxide layer disposed between said silicon nitride and said silicon oxynitride layers, and said silicon dioxide layer disposed below said silicon oxynitride layer are in the ratio of 4:2:1, respectively.

9. A method as in claim 8 wherein:
said etching of said silicon nitride and said silicon oxynitride layers is accomplished in hot phosphoric acid; and
said etching of said silicon dioxide layers is accomplished in buffered hydrofluoric acid.

10. A method as in claim 1 wherein said etching steps are accomplished by reactive ion etching.

11. A method as in claim 10 wherein:
said first, second and third layers comprise silicon nitride, silicon dioxide and silicon nitride, respectively,
the thickness of said first layer being at least twice as thick as said third layer.

12. A method as in claim 1 wherein at least one of said first, second and third sub-set of openings is etched down to said substrate through said third layer.

13. A method as in claim 1 wherein:
said first regions are dielectric isolation regions; and
said second and third regions are the collector contacts and the base of bipolar transistors, respectively.

14. A method as in claim 1 wherein:
said first regions are dielectric isolation regions;
said second regions are the source and drain regions of field effect transistor of a first channel type, and
said third regions are the source and drain regions of field effect transistor of a second channel type.

15. A method as in claim 1 wherein said first, second and third layers comprise polycrystalline silicon, silicon dioxide and silicon oxynitride, respectively.

16. A method as in claim 15 wherein:
said etching of said polycrystalline silicon layer is accomplished in pyrocatechol;
said etching of said silicon dioxide layer is accomplished in buffered hydrofluoric acid; and
said etching of said silicon oxynitride layer is accomplished in hot phosphoric acid.

* * * * *